United States Patent [19]

Beyer et al.

[11] Patent Number: 4,671,851
[45] Date of Patent: Jun. 9, 1987

[54] METHOD FOR REMOVING PROTUBERANCES AT THE SURFACE OF A SEMICONDUCTOR WAFER USING A CHEM-MECH POLISHING TECHNIQUE

[75] Inventors: Klaus D. Beyer, Poughkeepsie; James S. Makris, Wappingers Falls; Eric Mendel, Poughkeepsie; Karen A. Nummy, Newburgh; Seiki Ogura, Hopewell Junction; Jacob Riseman, Poughkeepsie; Nivo Rovedo, Poughquag, all of N.Y.

[73] Assignee: International Business Machines Corporation, Armonk, N.Y.

[21] Appl. No.: 791,861

[22] Filed: Oct. 28, 1985

[51] Int. Cl.$^4$ ........................................... H01L 21/302
[52] U.S. Cl. ..................................... 156/645; 156/636; 156/648; 156/662; 156/663; 29/576 W; 29/580; 427/94
[58] Field of Search ............... 156/636, 645, 648, 662, 156/663; 148/DIG. 50, DIG. 114; 29/576 W, 580; 427/94

[56] References Cited

U.S. PATENT DOCUMENTS

| | | | |
|---|---|---|---|
| 3,386,864 | 6/1968 | Silvestri et al. | 148/175 |
| 3,886,000 | 5/1975 | Bratter et al. | 148/175 |
| 3,911,562 | 10/1975 | Youmans | 29/590 |
| 3,979,237 | 9/1976 | Morcom et al. | 156/3 |
| 3,998,673 | 12/1976 | Chow | 148/175 |
| 4,025,411 | 5/1977 | Hom-Ma et al. | 204/192 |
| 4,039,539 | 8/1977 | Nakamoto | 148/188 |
| 4,111,724 | 9/1978 | Ogiue et al. | 148/175 |
| 4,191,788 | 3/1980 | Harrington | 427/82 |
| 4,231,056 | 10/1980 | Taylor | 357/50 |
| 4,233,091 | 11/1980 | Kawabe | 148/175 |
| 4,255,207 | 3/1981 | Nicolay et al. | 148/174 |
| 4,269,636 | 5/1981 | Rivoli et al. | 148/175 |
| 4,307,180 | 12/1981 | Pogge | 430/314 |
| 4,375,645 | 3/1983 | Funatsu | 357/50 |
| 4,378,565 | 3/1983 | Ghezzo et al. | 357/23 |
| 4,398,992 | 8/1963 | Fang et al. | 156/643 |
| 4,612,701 | 9/1986 | Cox | 29/576 W |

FOREIGN PATENT DOCUMENTS 0071203 7/1982 European Pat. Off. ............... 21/32

OTHER PUBLICATIONS

IBM Tech. Disc. Bull., vol. 25, No. 12, May 1983, "Preventing Formation of Polysilicon Rails", C. G. Jambotkar, pp. 6607-6609.

Primary Examiner—S. Leon Bashore
Assistant Examiner—Andrew J. Anderson
Attorney, Agent, or Firm—Robert J. Haase

[57] ABSTRACT

A chemical-mechanical (chem-mech) method for removing $SiO_2$ protuberances at the surface of a silicon chip, such protuberances including "bird's heads". A thin etch stop layer of $Si_3N_4$ is deposited onto the wafer surface, which is then chem-mech polished with a $SiO_2$ water based slurry. The $Si_3N_4$ acts as a polishing or etch stop barrier layer only on the planar portions of the wafer surface. The portions of the $Si_3N_4$ layer located on the top and at the sidewalls of the "bird's heads" and the underlying $SiO_2$ protuberances are removed to provide a substantially planar integrated structure.

15 Claims, 11 Drawing Figures

METHOD FOR REMOVING PROTUBERANCES AT THE SURFACE OF A SEMICONDUCTOR WAFER USING A CHEM-MECH POLISHING TECHNIQUE

BACKGROUND OF THE INVENTION (1) Technical Field

The invention relates to methods for removing protuberances at the surface of a semiconductor wafer and more particularly to a method for removing the silicon dioxide protuberances (such as the "bird's heads") according to a chem-mech polishing technique. The "bird's heads" are produced by conventional Recessed Oxide Isolation (ROI) processes.

(2) Description of the Prior Art

In the monolithic integrated circuit technology, it is usually necessary to isolate various active and passive devices from one another in the integrated circuit structure. Among different possibilities, complete dielectric isolation is widely used because of the significant advantages this technique offers, including the reduction of parasitic capacitances, improved performances, also, the ability of allowing the abutting of certain regions (such as the base or the emitter) against the isolation sidewalls, thereby finally resulting both in greater integration densities and in self-alignment capabilities.

One form of dielectric isolation involves the formation of recesses or grooves at isolation regions in the silicon substrate covered with a thermally grown $SiO_2$ and $Si_3N_4$ layer. During the formation of the grooves, the remainder of the silicon substrate is coated by a protective photoresist film. During CF4 RIE etching the $Si_3N_4$, $SiO_2$ and the silicon are etched at isolation sites which are not covered by photoresist. Following the formation of the grooves by conventional etching, the silicon substrate is submitted to a conventional thermal oxidation step, whereby the exposed silicon in the grooves is converted into silicon dioxide and fills up the grooves as well as oxidizing further into the silicon, to form the isolation regions.

Unfortunately, the use of this isolation technique, so-called ROI, results in two major drawbacks known in the literature, as the "bird's beak" and the "bird's head" problems.

"Bird's heads"0 and "bird's beaks" are respectively non-planar silicon dioxide at the top periphery of the groove and the lateral oxidation underneath the silicon nitride layer. In particular the "bird's head" is a ridge-shaped protuberance which delineates the periphery of the recessed oxide isolation regions formed by the ROI process. The process leaves the silicon substrate fully coated with either a thick (at the ROI locations) or a thin (at other locations) $SiO_2$ layer. The "bird's head" results from lateral, vertical and stress enhanced oxygen diffusion during the oxidation step. More details concerning the stress phenomenon and the different troubles caused by the ROI process, can be found in the published European patent application No. 82106651.1 (Publication Number 071203) to Kemlage, and assigned to the same assignee as the present invention.

First of all, where associated with the "bird's head", the "bird's beak" produces difficulties when it is necessary to subsequently achieve good abutted diffusion regions against the sidewalls of the dielectric isolation region.

Secondly, the growth of the "bird's head", of an approximate height of 0.5 $\mu$m, produces a bumpy or irregular silicon surface topography during the ROI process. As a first consequence, the non-planarity of the silicon surface can lead to the formation of polysilicon rails during the timed Reactive Ion Etching (RIE) of doped polysilicon used to provide electrical contacting to the base and/or emitter regions. These polysilicon rails contribute to electrical shorts between adjacent devices. This phenomenon can be understood from the teachings of an article entitled "Preventing formation of polysilicon rails" by C.G. Jambotkar, and published in the IBM Technical Disclosure Bulletin. Vol. 25. No. 12, May 1983, pp 6607-6608. Another consequence of the non planarity of the substrate surface, is the potential breakage of metal lands to be subsequently formed. Finally, it is widely recognized that a planar surface is beneficial to multi-level metal personalization schemes, by increasing significantly both wiring densities and reliability of the final devices.

Recently, the isolation has been considerably improved by forming a trench in the center of the ROI region. The trench may be filled with doped polysilicon to provide an electrical contact with the substrate where desired, or in other applications, the trenches are filled with a dielectric insulating material, such as intrinsic polysilicon or silicon dioxide to provide additional isolation between devices.

There have been many attempts so far to solve the acute problems mentioned above resulting from the formation of these $SiO_2$ ridge-shaped protuberances.

According to several references, different manufacturing processes have been suggested to define new processing steps in order to avoid such a formation. Illustrating this approach, the above mentioned European patent application describes a process where the underlying $SiO_2$ layer is replaced by a silicon oxynitride ($SiO_xN_y$) layer. Also in U.S. Pat. No. 3,886,000 to R. L. Bratter, the underlying $SiO_2$ layer is eliminated and a silicon oxynitride layer is formed directly on the silicon substrate. All these techniques have been wanting in demonstrating effectiveness and controllability. In addition, they employ materials such as $SiO_xN_y$ which are not widely used in this industry.

Unlike this approach, other proposals do not remove the problem but find a partial solution of the problem after it occurs. For example, U.S. Pat. Nos. 4,025,411 to Y. Hom-Ma and 4,039,359 to N. Nakamoto describe the problems caused by the "bird's heads" and suggest to solve it by an etching of the ridge, in order to planarize the structure.

In the former reference, the protuberances or "bird's heads" projecting above the surface of the substrate, which directly result from the ROI process, are removed by: first planarizing the structure with a planarizing medium such as a photoresist (having approximately the same etching rate as $SiO_2$), then etching back both $SiO_2$ and the photoresist with the same etching rate, for instance in a RF sputtering equipment. The result is a silicon wafer with a flat surface. In the latter reference, an alcohol solution of a doping impurity such as boron, is applied to the substrate surface having "bird's heads". By a thermal treatment, the solution is converted into a boron doped $SiO_2$ film, which has approximately the same etching characteristics that the underlying $SiO_2$. The substrate is immersed in an appropriate etchant, which etches both oxides at the same rate. According to this process, the "bird's heads" are smoothed, however the process claims only a reduction of the step height (e.g. from 0.6 to 0.2 microns), but not a complete removal. In addition, with this process, P doped regions are formed in the silicon locations covered with said boron doped SiO$_2$ film and therefore may constitute an additional limitation to this particular process.

OBJECTS OF THE INVENTION

It is therefore a primary object of the present invention to provide a method for totally removing asperities, typically SiO$_2$ protuberances, from the main or active surface of a silicon substrate, by a polishing technique.

It is another object of the present invention to provide a method for totally removing asperities, typically SiO$_2$ protuberances, from the main or active surface of a silicon surface, based on a chemical-mechanical (chem-mech) polishing technique, therefore eliminating the need of employing photoresists as a planarizing medium, which are known to be a source of contamination.

It is another object of the present invention to provide a method for totally removing asperities, typically SiO$_2$ protuberances, from the main or active surface of a silicon substrate, by a chem-mech polishing technique, fully compatible with any known semiconductor manufacturing process.

It is another object of the present invention to provide a method for totally removing asperities, typically SiO$_2$ protuberances, as those resulting from a CVD SiO$_2$ fill near the edge of the isolation region, to subsequently achieve good abutted diffusion regions against the sidewalls of the ROI regions with limited mask alignment problems.

It is still another object of the present invention to provide a method for totally removing asperities, typically SiO$_2$ protuberances, as those resulting from the ROI process and usually called "bird's heads", to avoid the formation of undesired polysilicon rails when polysilicon deposition is performed for electrical contact purposes.

It is still another object of the present invention to provide a method for totally removing asperities, typically SiO$_2$ protuberances, as those resulting from the ROI process and usually called "bird's heads", to leave a perfectly smooth and planar substrate surface, appropriate for further processing with improved wiring densities and reliability.

It is still another object of the present invention to provide a method for simultaneously removing the "bird's heads" and polysilicon in the polysilicon filled trench substrate contact technology, in order to leave a perfectly smooth and planar substrate surface, where the surface of the remaining polysilicon and of the ROI region are substantially coplanar.

SUMMARY OF THE INVENTION

The present invention is a method for removing the asperities, typically the ridge-shaped SiO$_2$ protuberances (so-called "bird's heads") resulting from the ROI process at the surface of the silicon substrate. The invention is accomplished by applying chemical-mechanical polishing to said surface, which has been previously coated with a blanket polishing stop barrier layer, typically of CVD (Chemical Vapor Deposition) Si$_3$N$_4$. The portions of the Si$_3$N$_4$ layer, located on the curved top of the "bird's heads" and the underlying SiO$_2$ protuberances, are removed because they are submitted to a considerably higher chem-mech polishing rate than the portions covering the planar substrate surface. This CVD Si$_3$N$_4$ layer unexpectedly acts therefore as a polishing or etch stop barrier layer only on the planar portions of the substrate surface. The difference between these polishing rates may be varied simply by controllably applying different pressure magnitudes on the polishing pad. A successful planarization of the protuberances by a chem-mech polishing process depends on the polishing solution chemistry. In that respect, SiO$_2$ water based slurries have demonstrated their efficiency. Polishing rate ratios between SiO$_2$ and Si$_3$N$_4$ preferably should be between a lower limit of four to one and a higher limit of forty to one. According to the present invention, it has been unexpectedly demonstrated that only the silicon nitride on the "bird's heads" and the silicon dioxide thereunder, are removed during the polishing process, while the remaining portions of the silicon nitride located on the planar surface of the wafer, do effectively act as an etch stop layer.

The foregoing and other objects, features and advantages of the invention will be apparent from the following more particular description of a preferred embodiment of the invention as illustrated in the accompanying drawings.

DESCRIPTION OF THE PREFERRED EMBODIMENTS

The preferred embodiments which will be described in the present description, relate to the manufacturing of standard integrated circuits. In the first preferred embodiment detailed thereafter, the SiO$_2$ protuberances will be the "bird's heads" as resulting from the standard ROI process, where grooves are first formed in the silicon substrates, then the exposed silicon is thermally oxidized to form the ROI regions. In said first preferred embodiment, the ROI process is combined with the polysilicon filled trench substrate contact technology according to which a trench is formed in the ROI regions, then filled with doped polysilicon to achieve low resistivity electrical contacts with the silicon substrate.

Figure 1:
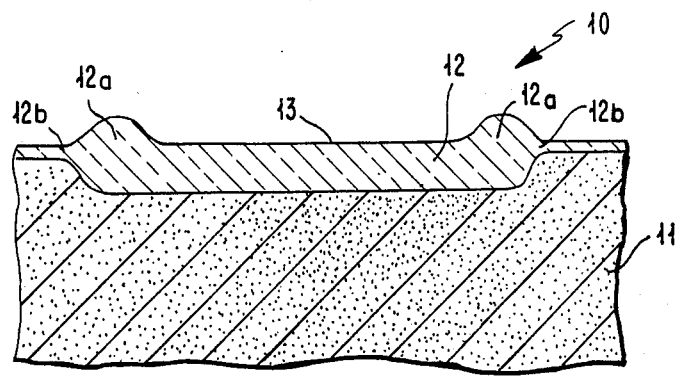
FIGS. 1 through 8 illustrate one method embodiment of removing protuberances by using the chem-mech polishing technique of the present invention, when the polysilicon filled trench substrate contact technology is combined with the standard ROI process, and the substantially planar structure resulting therefrom.

Referring now, more particularly to FIG. 1, there is shown a schematic cross sectional view of a semiconductor structure 10, typically a silicon substrate 11 of a predetermined type of conductivity and provided with a Recessed Oxide Isolation (ROI) region 12. It is to be understood, that usually substrate 11 is in fact comprised of a P− silicon substrate having a N+ blanket subcollector region with a N− epitaxial layer grown on it. The structure, as a part of a silicon wafer, has been produced with known processing steps, such as described in the above mentioned European patent application, i.e. the steps of: providing a silicon substrate; depositing a silicon oxide layer and then a silicon nitride layer to form a composite layer on said substrate; removing determined portions of said composite layer to form a patterned oxidation mask stack or ROI mask which exposes selected areas of the substrate; oxidizing said exposed areas to create Recessed Oxide Isolation regions to isolate one device from the another; finally removing said oxidation mask to expose the whole substrate. The structure shown in FIG. 1, directly results from this process and exhibits both "bird's head" and "bird's beak" characteristics respectively referenced 12a and 12b. In particular, the "bird's head" referenced by numeral 12a, can be understood as a ridge-shaped $SiO_2$ protuberance, which delineates the periphery of the ROI region at the surface of the substrate. The substrate 11 has therefore an irregular $SiO_2$ surface 13 with $SiO_2$ protuberances corresponding to said previously mentioned "bird's head" 12a. The thickness of the ROI region 12 is about 1000 nm.

As said above, according to a preferred embodiment, the invention will be described by reference to a process sequence leading to the simultaneous removal of the "bird's head" and of the polysilicon trench fill in the particular polysilicon substrate contact technology.

Figure 2:
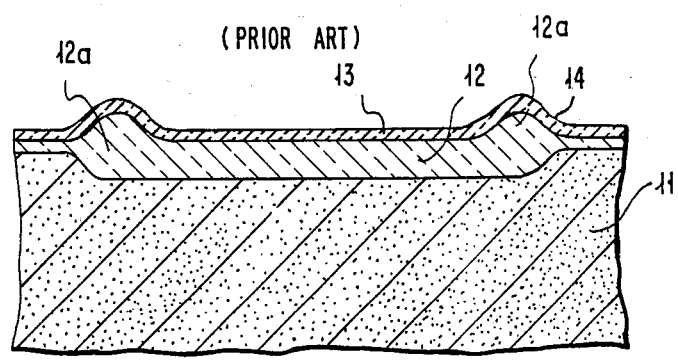
Figure 3:
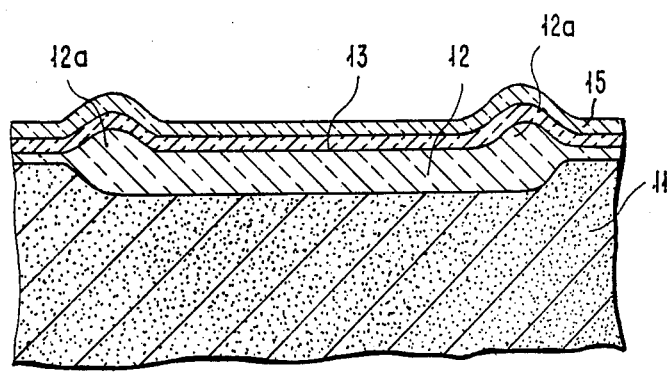
Figure 4:
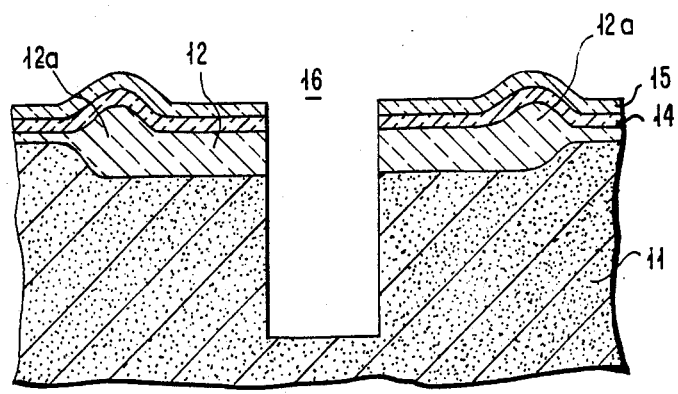

A new $Si_3N_4$ layer 14 is blanket deposited by LPCVD (Low Pressure Chemical Vapor Deposition) as shown in Fig.2, and conforms with the topography of the substrate surface. The $Si_3N_4$ layer has to be sufficiently thick (about 50 to 300 nm), to be subsequently used as a polishing stop barrier during the chem-mech polishing process. Then, the structure of FIG. 2 is placed in a Low Pressure Chemical Vapor Deposition (LPCVD) equipment to produce a $SiO_2$ layer 15 with preferably a thickness of about 500 nm, which acts as a trench etch masking oxide. As shown in FIG. 4, a trench 16 is now formed according to standard Reactive Ion Etching (RIE) techniques in a $CF_4$ atmosphere to etch the dielectrics. The silicon etching (depth of about 4.5 $\mu$m) is performed in a $SF_6/Cl_2$ atmosphere.

Figure 5:
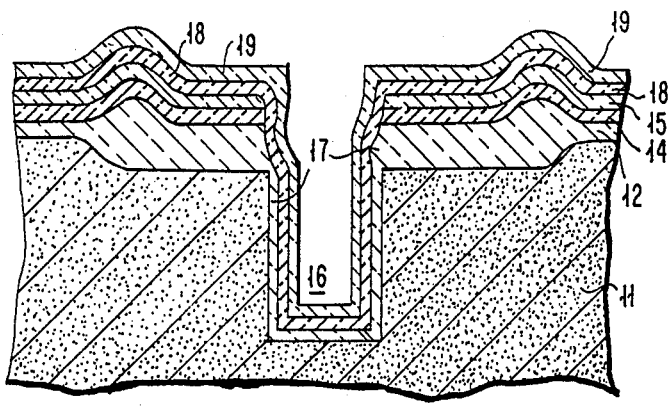
Figure 6:
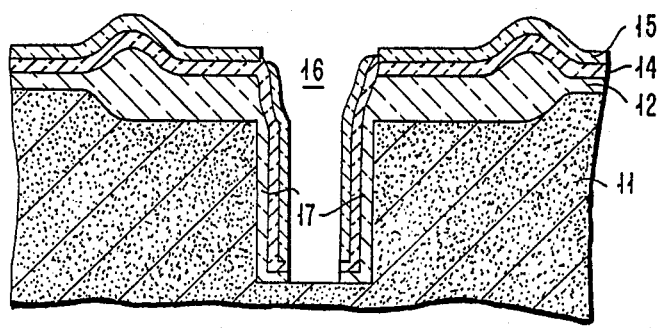
Figure 7:
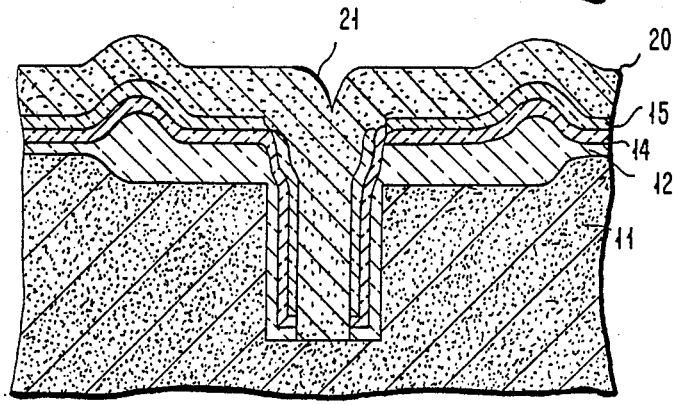

A composite dielectric layer is now formed, (see FIG. 5) consisting of a thermal $SiO_2$ layer 17 (about 50 nm), a CVD $Si_3N_4$ layer 18 (50 to 100 nm), and a CVD $SiO_2$ layer 19 (200 to 500 nm). The total composite layer, which acts to passivate the trench, should be sufficiently thick to prevent capacitive coupling between doped silicon trench fill and adjacent devices, as well known. However, the Si3N4 layer 18 should not be too thick, excessive thickness would result in non desired dislocations in the silicon substrate, during subsequent hot processing steps. The bottom of the trench is opened by Reactive Ion Etching (RIE) to expose the substrate (see FIG. 6). The trench is filled with boron-doped polysilicon according to conventional techniques, e.g. either by depositing polysilicon in a RF equipment or by epitaxial silicon deposition, which selectively deposits on silicon but not on the composite dielectric layer. Appropriate techniques are described in U.S. Pat. Nos. 4,233,091 to Y. Kawabe and 4,473,598 to L. M. Ephrath, the latter being assigned to the same assignee as of the present invention. The following two step process is recommended: first a 200 nm thick LPCVD intrinsic polysilicon is deposited to act as a nucleation layer, at a low temperature (650° C.), followed by deposition at high temperature (1000° C.) of a 2500 nm of boron-doped polysilicon. The resulting structure with an overlying layer 20 of polysilicon, is shown in FIG. 7. As clear from FIG. 7 the surface of the structure is not flat but rather irregular because both the composite layer and the polysilicon layer, have been deposited conformally. The surface is bumpy at the location of the "bird's head" and one may notice a typical cusp 21 at the location of the center of the trench. The structure of FIG. 7 will now be planarized according to the chem-mech polishing method of the present invention. It is to be noted that the method is an in-line process and is fully compatible with any known semiconductor manufacturing process.

A 24 inch diameter two side free polisher or a 18 inch diameter Strasburgh single side polisher in conjunction with a Rodel 210 finishing pad, can be used as the polishing equipment. The polishing slurry consists of 8 liters of fifty weight percent colloidal silicon (Monsanto Syton HT 50 or Nalco Nalcoa 2349), 150 gr of the sodium salt of dichloroisocyanuric acid, 450 gr of $Na_2CO_3 H_2O$ and 32 liters of de-ionized (D.I.) water.

The following set of specifications summarizes the above polishing conditions:
(1) Polishing media: colloidal $SiO_2$ dispersed in water.
(2) Slurry pH: alkaline, pH 9.5–12.5
(3) Slurry flow rate: 400–500 cc/min on two side free polisher 100–200 cc/min on Strasburgh single side polisher
(4) Polish pressure: 2.5 psi
(5) System temp.: 40°–50° C.
(6) Polishing pads: Top pad—Perforated Suba 4 on two side free polisher. Bottom pad—Rodel 210 I 2 on both types of polishers (Both pads from Rodel Inc.)

It has been found experimentally that water based silicon dioxide slurries polish the silicon layer without following the contour of the cusp, which is a part of the 3 $\mu$m thick polysilicon layer. The depth of the cusp may be as great as 1.5 $\mu$m. Removing 1.5 to 2 microns of the polysilicon by polishing, completely removes the cusp. The selection of the polishing pads is important for uniform removal. During the chem-mech polishing, a total number of twelve wafers were polished simultaneously. The polishing rates of $Si_3N_4$ and polysilicon were determined. The thickness of one test wafer covered with $Si_3N_4$ or thermally grown $SiO_2$ or polysilicon was measured initially. The eleven load silicon wafers were chosen in such a way that their wafer thicknesses were approximately the same and either higher or lower than of the thickness of the test wafer. The impact of the wafer thickness on the $Si_3N_4$ polishing rate is shown in Table I. If the $Si_3N_4$ test wafer is thinner than the load wafers, the $Si_3N_4$ polishing rate is between 12.4 and 18.7 nm/min according to run 1, 3, and 5 of Table I. On the other hand, if the $Si_3N_4$ test wafer is thicker than the load wafers, the $Si_3N_4$ polishing rate is between 25.5 and 36.5 nm/min according to run 4, 6, and 7.

TABLE I

| RUN | POLISHING RATE IN nm/MIN | STARTING WAFER TEST WAFER | THICKNESS ($\mu$m) LOAD WAFER |
|---|---|---|---|
| 1 | 12.4 | .396 | .409 |
| 2 | 23.5 | " | .396 |
| 3 | 14.3 | " | .403 |
| 4 | 25.5 | .401 | .396 |
| 5 | 18.7 | " | .403 |
| 6 | 36.5 | .403 | .401 |
| 7 | 33.2 | " | .398 |

The dependency of the $Si_3N_4$ polishing rate on wafer thickness can be projected from the wafer to wafer study to a single wafer with locally different thicknesses. It is remarkably unexpected to note that $Si_3N_4$ protuberances are polished significantly faster than $Si_3N_4$ on planar surfaces. Only the $Si_3N_4$ on the "bird's heads" and the $SiO_2$ thereunder are removed during the planarization process, while the remaining portions of $Si_3N_4$ act as a stop layer.

As shown in Table II, the appropriate polishing rate ratios between thermally grown $SiO_2$ and $Si_3N_4$ and between polysilicon and $Si_3N_4$ are six to one and eight to one, respectively. Within that limit, $Si_3N_4$ can act effectively as a polishing stop barrier layer for thermally grown $SiO_2$ and for polysilicon. However, in its broader range, polishing rate ratios between $SiO_2$ and $Si_3N_4$ comprised between a lower limit of four to one and a higher limit of forty to one, should be acceptable. For polishing rate ratios lower than the low limit, $Si_3N_4$ cannot act as a polishing stop layer on planar $SiO_2$ surfaces. For polishing rate ratios greater than the high limit, the $Si_3N_4$ polishing rate is too slow to remove $Si_3N_4$ on the top and at the sidewalls of $SiO_2$ protuberances, efficiently.

TABLE II

| MATERIAL | POLISHING RATE IN nm/MIN | STARTING WAFER TEST WAFER | THICKNESS ($\mu m$) LOAD WAFER |
|---|---|---|---|
| $Si_3N_4$ | 18.7 | .401 | .403 |
| $SiO_2$ | 115.8 | .403 | .409 |
| POLYSIL. | 164.3 | .424 | .429 |

Figure 8:
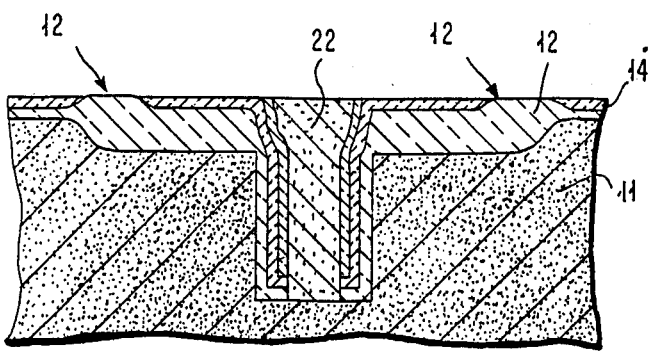

The final structure after planarization is illustrated in FIG. 8. As clearly shown, the tops of the "bird's heads" 12a have been removed, leaving a perfectly planarized structure. A polysilicon stud 22 remains in the trench to provide substrate contacting. At the device locations, the $SiO_2$ layer produced originally by the ROI process is now coated by the $Si_3N_4$ polishing stop barrier which can be beneficial for subsequent processing steps, as an additional insulating layer. The structure of FIG. 8 is now ready for completing the remaining steps of the conventional semiconductor processing.

It is to be understood that the description should not be construed to be limited to the particular embodiment discussed above, the invention being of wide application. A second preferred embodiment will be described now, where the ROI regions are not created by thermal oxidation but by filling the groove (or recess) with a dielectric material such as $SiO_2$.

Figure 9:
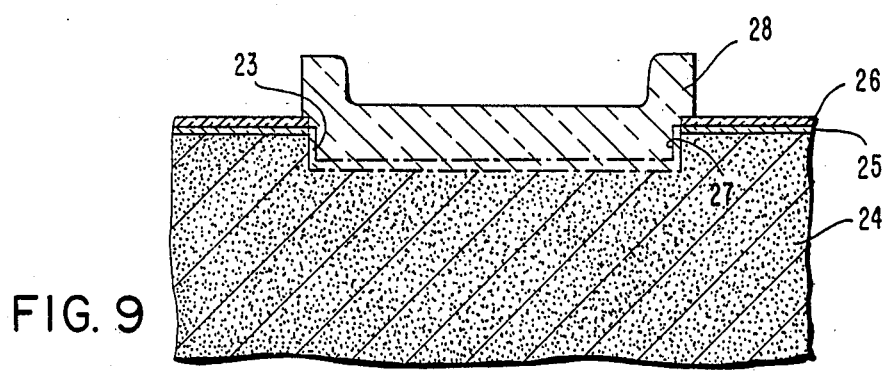
FIGS. 9 through 11 illustrate another method embodiment of removing protuberances by using the chem-mech polishing technique of the present invention, when the ROI process includes the step of forming the ROI regions by silicon dioxide deposition instead of by thermal oxidation.

As shown in FIG. 9, a conventional recess (or groove) 23 of a width between 5 and 200 $\mu m$ and of a depth between 0.5 and 1.0 $\mu m$, has been formed into a silicon 24 either by RIE processing, or by wet etching. The silicon is etched while a thermal oxide/LPCVD $Si_3N_4$ composite layer structure 25/26 passivates the silicon surface outside the groove and acts as the ROI mask stack. After the growth of a very thin thermal oxide layer 27 between 25 and 50 nm (and optionally a very thin $Si_3N_4$ layer between 25 and 50 nm), an undoped CVD $SiO_2$ or a CVD borosili layer 28 is deposited. Other suitable materials such as CVD glasses can be deposited as well, preferably glasses with a thermal expansion coefficient matching the one of silicon in order to reduce thermal stresses. According to FIG. 9, the thickness of the CVD oxide layer 28 should be slightly higher than the depth of the ROI recess. As shown in FIG. 9, CVD $SiO_2$ protuberances are formed at the edge of a ROI region where the $SiO_2$ layer 28 overlaps the ROI mask stack. $SiO_2$ layer 28 is delineated by utilizing non critical photo alignment step with a subsequent oxide removal by a HF or buffered HF solution steps outside the areas covered by photoresist.

Figure 10:
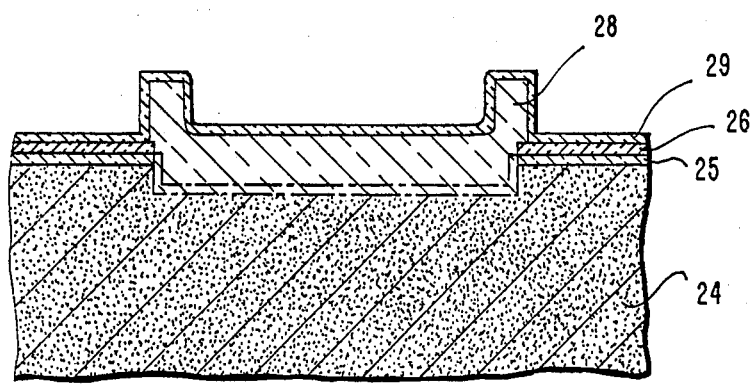
Figure 11:
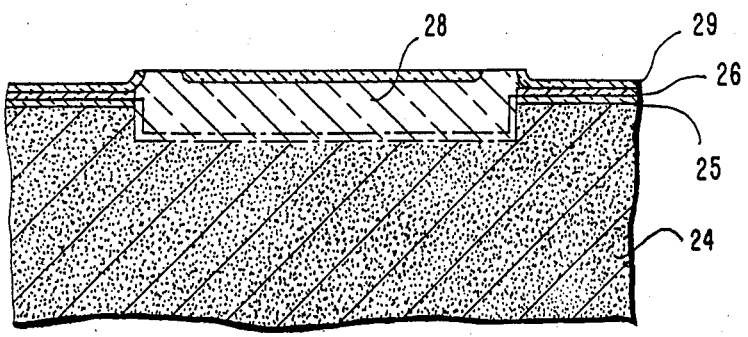

As shown in FIG. 10, after the removal of the photoresist (not shown), a CVD $Si_3N_4$ layer 29 is blanket deposited onto the structure, and will subsequently act as polishing stop layer in the flat portion of the ROI region. According to FIG. 11, after chem-mech polishing of the CVD $SiO_2$ protuberances using the method described above, a rather planar ROI isolation region 28 is obtained, which does not contain any "bird's head" or "bird's beak". Also, as long thermal oxidation steps were omitted, the defect density is substantially reduced near the ROI region. Introducing the chem-mech method of the present invention in that alternative of the ROI process allows therefore the production of ROI regions without "bird's head" and "bird's beak" and their related defects. In addition it provides an integrated structure with a substantially smooth and planar surface.

The trenches may thus be formed and processing continued until final completion of the desired FET or bipolar devices. The polishing stop layer 29 is especially useful in cases where narrow as well as wide (in excess of about 20 $\mu m$) oxide-filled trenches are employed, to avoid the tendency of the chem-mech polishing action to remove excess amounts of such wide trench oxide, relative to the oxide within the narrower trenches, that otherwise would occur in the absence of an oxide polishing stop. Alternatively, layer 28 of FIG. 9 may be left unpatterned and polishing stop layer 29 may be more fully removed (not shown) by a non-critical masking step except over the central region of a wide oxide-filled trench to avoid excessive removal of the oxide in such central trench area. The omission of a silicon polishing stop as well as an oxide polishing stop is feasible in those relatively few instances where all of the trench widths are less than about 20 $\mu m$ (eliminating the need for an oxide polishing stop) and only FET devices are to be formed on the chip between the trenches eliminating the need for a silicon polishing stop. FET devices are surface devices, do not require thin epitaxial layers (if any) and do not require a great depth of silicon dioxide to adequately isolate one device from another. Hence, the inadvertent removal of some small surface amounts of silicon from the FET device area of the chip is of no serious consequence so that a silicon polishing stop is not needed.

The present invention focuses on the chem-mech polishing planarization of $SiO_2$ "bird's head" formed during the formation of the ROI region, either by thermal oxidation or by oxide deposition. It is to be understood that the method of the present invention may be applied to any kinds of glassy protuberances, formed during any step of the semiconductor processing. For example, in certain applications, glass films are deposited on silicon substrates. The surfaces of these glass films are frequently characterized by protuberances measuring typically 0.5 $\mu m$ in height, and covering an area of several square microns at their base. These surface protuberances are still considered to be detrimental surface features. Examples of others protuberances, such as $SiO_2$ studs or bumps, are described in U.S. Pat. No. 4,473,598 (see reference 11 in FIG. 6). They can also be planarized with the above method. On the other hand, said method may also be adapted to others materials similar to undoped thermal or CVD $SiO_2$, such as CVD borosilicate or CVD boroalumina silicate glasses, and the like with only minor changes in the parameters of the process. It is also clear that the invention is not limited to those particular embodiments described above, but may still be applied to structures having other standard ROI regions or where the recessed oxide surrounds either a deep polysilicon or a dielectric filled trench, to provide device isolation. However, as explained above, it is only required that the fill material for the trench, has a substantially higher polishing rate for chem-mech polishing than the polishing stop barrier material such as $Si_3N_4$ which has been selected in this preferred embodiment.

Complete bipolar devices were built utilizing conventional processing after the formation of the isolation. The collector-emitter breakdown yields were determined for processes removing the "bird's heads" by the chem-mech polishing process of the present invention, by RIE planarization as described in the prior art statement and by a standard process, which did not eliminate the "bird's head" at all. According to the results which were obtained, the yields of the different isolation processes were found comparable.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

Having thus described our invention, what we claim as new and desire to secure by letters patent is:

1. Method for removing protuberances at the surface of a semiconductor wafer, comprising the steps of:
   (a) preparing a semiconductor substrate having an irregular surface provided with protuberances as well as planar surface portions,
   (b) blanket depositing a layer of a polishing stop barrier onto said irregular surface,
   (c) chem-mech polishing said surface to remove only the portions of said polishing stop barrier layer located at the top and at the sidewalls of the protuberances and the protuberances underlying said removed portions as well, while the other portions located on the planar surfaces of said polishing stop barrier layer remain substantially unattacked.

2. Method according to claim 1, wherein said protuberances are glassy.

3. Method according to claim 1, wherein the material forming said polishing stop barrier layer is $Si_3N_4$.

4. Method according to claim 3, wherein the thickness of said layer is about 100 nm.

5. Method according to claim 3 wherein said protuberances are comprised of $SiO_2$.

6. Method according to claim 5 wherein $SiO_2$ protuberances are the so-called "bird's heads" which normally result from the Recessed Oxidation Isolation (ROI) process, at the periphery of the ROI regions.

7. Method according to claim 6 wherein during said chem-mech polishing step an $SiO_2$ water based slurry is used comprising 8 liters of fifty weight percent colloidal silicon, 150 gr of the sodium salt of dichloroisocyanic acid, 450 gr of $Na_2CO_3 H_2O$ and 32 liters of deionized water.

8. Method according to claim 7 wherein the polishing rate ratio between $SiO_2$ and $Si_3N_4$ is between 4:1 and 40:1.

9. Method according to claim 8 wherein said polishing ratio is selected around 6:1.

10. Method according to claim 9 wherein the chem-mech polishing parameters are slurry flow rate 400-500 cc/min on a two side free polisher and 100-200 cc/min on a single side polisher, polishing pressure 2.5 psi, and temperature 40°-50° C.

11. Method of forming a substantially planar integrated structure provided with a Recessed Oxidation Isolation (ROI) region having a polysilicon filled deep trench therein comprising the steps of:
   (a) providing a silicon substrate having a planar surface portion as well as an ROI region exhibiting an $SiO_2$ "bird's head" causing an irregular surface of said substrate;
   (b) depositing a layer of a $Si_3N_4$ polishing stop barrier onto said irregular surface and planar surface portion;
   (c) depositing a trench etch masking layer of $SiO_2$ onto the structure;
   (d) forming a trench in the ROI region;
   (e) growing a thin layer of thermal $SiO_2$ on the exposed silicon in the trench;
   (f) depositing a layer of $Si_3N_4$ by CVD;
   (g) depositing a layer of $SiO_2$ by CVD;
   (h) RIE etching to remove the $Si_3N_4$ and $SiO_2$ layers at the bottom of said trench;
   (i) depositing a layer of polysilicon; and,
   (j) chem-mech polishing the surface of the structure to remove both said polysilicon layer except in said trench and said trench etch masking layer and to remove the portions of said polishing stop barrier located at the top and at the sidewalls of the protuberances and the underlying $SiO_2$ as well while the other portion located on the planar surfaces of said polishing stop barrier remain substantially unattacked.

12. Method of forming a substantially planar integrated structure provided with a Recessed Oxide Isolation (ROI) Region without "bird's head" or "bird's beak" characterisitcs comprising the steps of:
   (a) providing a silicon substrate having substantially planar portions passivated with a composite $SiO_2$-$Si_3N_4$ ROI mask stack and having a recess formed therein to expose silicon at the ROI region locations;
   (b) depositing an $SiO_2$ layer onto the structure, which in particular fills the recess; and
   (c) provides $SiO_2$ protuberances at the periphery of the ROI region;
   (d) depositing a layer of $Si_3N_4$; and
   (e) chem-mech polishing the surface of the structure to remove the portions of said $Si_3N_4$ layer located at the top and at the sidewalls of the protuberances and the underlying $SiO_2$ as well while the other portions located on the planar surfaces of said $Si_3N_4$ layer remain substantially unattacked.

13. Method of claim 12 wherein previous to step (b), a layer of thermal oxide is grown on the exposed silicon in the recess.

14. Method of forming a substantially planar integrated structure provided with a Recessed Oxide Isolation (ROI) Region without "bird's head" or "bird's beak" characteristics comprising the steps of:
   (a) providing a substantially planar silicon substrate having a recess formed therein at the ROI region locations, said recess being at least about 20 μm wide;
   (b) depositing an $SiO_2$ layer onto the structure, which in particular fills the recess; and
   (c) provides $SiO_2$ protuberances at the periphery of the ROI region;

(d) depositing a layer of $Si_3N_4$ within said periphery of said regions; and (e) chem-mech polishing the surface of the structure to remove the portions of said $Si_3N_4$ layer located at the top and at the sidewalls of the protuberances and the underlying $SiO_2$ as well while the other portions located on the planar surfaces of said $Si_3N_4$ layer remain substantially unattacked.

15. Method of forming a substantially planar integrated structure provided with Recessed Oxide Isolation (ROI) Regions without "bird's head" or "bird's beak" characteristics comprising the steps of:

(a) providing a substantially planar silicon substrate having narrow as well as wide recesses formed therein at the ROI region locations, said wide recesses being at least about 20 $\mu$m wide;

(b) depositing an $SiO_2$ layer onto the structure, which in particular fills the recesses; and (c) provides $SiO_2$ protuberances at the periphery of the ROI regions;

(d) depositing a layer of $Si_3N_4$ within said periphery of said wide regions; and (e) chem-mech polishing the surface of the structure to remove the portions of said $Si_3N_4$ layer located at the top and at the sidewalls of the protuberances and the underlying $SiO_2$ as well while the other portions located on the planar surfaces of said $Si_3N_4$ layer remain substantially unattacked.

* * * * *